(12) United States Patent
Schmidt

(10) Patent No.: US 8,749,311 B2
(45) Date of Patent: Jun. 10, 2014

(54) ACTIVE ANTENNA ARRANGEMENT WITH DOHERTY AMPLIFIER

(71) Applicant: Lothar Schmidt, Erbach (DE)

(72) Inventor: Lothar Schmidt, Erbach (DE)

(73) Assignee: Kathrein-Werke KG, Rosenheim (DE)

( * ) Notice: Subject to any disclaimer, the term of this patent is extended or adjusted under 35 U.S.C. 154(b) by 0 days.

(21) Appl. No.: 13/933,479

(22) Filed: Jul. 2, 2013

(65) Prior Publication Data

US 2013/0293307 A1 Nov. 7, 2013

Related U.S. Application Data

(63) Continuation of application No. 13/298,822, filed on Nov. 17, 2011, now abandoned.

(51) Int. Cl.
H03F 3/68 (2006.01)
(52) U.S. Cl.
USPC ...................................... 330/295; 330/124 R

(58) Field of Classification Search
USPC ................................ 330/295, 124 R, 286, 84
See application file for complete search history.

(56) References Cited

U.S. PATENT DOCUMENTS

| 2,658,959 | A | 11/1953 | Doherty |
| 7,414,478 | B2 | 8/2008 | Elmala et al. |
| 7,961,048 | B2 | 6/2011 | Oakley et al. |
| 2009/0179702 | A1 | 7/2009 | Blednov |

OTHER PUBLICATIONS

W. H. Doherty, A New High-Efficiency Power Amplifier for Modulated Waves, Bell Telephone Laboratories, May 1936, 25 pages.

*Primary Examiner* — Hieu Nguyen
(74) *Attorney, Agent, or Firm* — Stephen H. Eland; Dann, Dorfman, Herrell & Skillman

(57) ABSTRACT

A Doherty amplifier (100) is described which comprises an input terminal (102) for receiving an input signal (101) and an output terminal (103) for providing an amplified signal (104) of the input signal (101). The Doherty amplifier is supplied by a first supply voltage and a second supply voltage which have opposite polarities in respect to a reference level.

12 Claims, 6 Drawing Sheets

ACTIVE ANTENNA ARRANGEMENT WITH DOHERTY AMPLIFIER

PRIORITY APPLICATIONS

This application is a continuation of U.S. patent application Ser. No. 13/298,822, filed Nov. 17, 2011. The entire disclosure of the foregoing application is hereby incorporated herein by reference.

FIELD OF THE INVENTION

This field of the present application relates in general to a Doherty amplifier and in particular to an active antenna arrangement comprising at least a Doherty amplifier. The field of the application also relates to a method of manufacturing a chipset with a Doherty amplifier and a method of manufacturing a hybrid module of a Doherty amplifier.

BACKGROUND OF THE INVENTION

The use of mobile communications networks has increased over the last decade. Operators of the mobile communications networks have increased the number of base stations in order to meet an increased demand for service by users of the mobile communications networks. The operators of the mobile communications network wish to purchase components for the base stations at a lower price and also wish to reduce the running costs of the base station. Active antenna arrangements with Doherty Amplifiers have proven to meet these goals.

The Doherty amplifier is first known from U.S. Pat. No. 2,658,959 as an efficiency improved amplifier arrangement made of vacuum tubes for modulated signals. Since then the name Doherty amplifier has been recognized in the industry to refer to two parallel amplifier stages (vacuum tubes which were subsequently substituted by transistors), whereby a first amplifier stage operates in class AB mode and a second amplifier stage operates in class C mode. Usually the first stage is biased in such a way that it linearly amplifies the input signal of the first stage from zero excitation to carrier level. The first amplifier stage therefore is also called main stage. The second amplifier stage is biased in such a way that it amplifies signals above a certain threshold, i.e. input signals above the carrier level. Therefore it is usually called peak amplifier stage. In order to improve load balancing, the input signals of both amplifiers are shifted in phase so that the phase difference between the input signals of both amplifier stages is 90 degrees apart. In this way the phase of the output signals of the main stage and the peak stage are also 90 degrees apart. In order to form the output signal of the Doherty amplifier the phase shifted output signals are recombined in-phase.

In the original U.S. Pat. No. 2,658,959 the phase shifting between the input signal of the main stage and the input signal of the peak stage was achieved by a LC-voltage divider between the input of the amplifier arrangement and the input of the main stage; and a CL-voltage divider between the input of the amplifier arrangement and the input of the peak amplifier stage. As a result of this arrangement one input signal was retarded by 45 degrees in relation to the input signal of the amplifier arrangement. In contrast hereto the input signal of the other amplifier was 45 degrees advanced in relation to the input signal. The overall effect was to make both amplifiers work at a phase difference of 90 degrees.

In the paper "A New High-Efficiency Power Amplifier for Modulated Waves", Bell Telephone System Technical Publications B-931 in 1936, Doherty also describes the use of 90 degree networks. FIG. 9 in this paper depicts two different applications. In the first application the input signal of the Doherty amplifier is passed through a −90 degree network before it is fed to the input of the first amplifier stage, whereas the input signal of the Doherty amplifier is fed directly to the input of the second amplifier stage, without applying any phase changes. A second −90 degree network at the output of the second amplifier stage retards the output of the second amplifier stage, so that the output signal of first amplifier stage and the output signal of the second amplifier stage after the second −90 degree network are in-phase and can be re-combined. A second application depicted in the said figure shows how to use a negative shifting 90 degree network at the input and a positive 90 degree shifting network at the output of the same amplifier stage. By this the phase difference within the same stage is compensated and the signals of the first and the second stage can be re-combined in-phase.

The stages of a Doherty amplifier may be formed by bipolar transistors or field effect transistors (FET). US Patent Application Publication 2009/0179702 A1 shows a Doherty amplifier arrangement comprising first and second bipolar transistors as well as first and second field effect transistors.

SUMMARY OF THE INVENTION

It is an aspect of the teachings of this application to provide a Doherty amplifier that can be produced at lower cost. The Doherty amplifier according to the teachings disclosed herein comprises an input terminal for receiving an input signal and an output terminal for providing an amplified signal of the input signal. The Doherty amplifier is supplied by a first supply voltage and a second supply voltage which have opposite polarities in respect to a reference level. A first transistor has a first control input for receiving a first input signal derived from the input signal, a first output, and a first supply input connected to the second supply voltage. A second transistor has a second control input for receiving a second input signal being derived from the input signal, an output, and a second supply input connected to the second supply voltage, wherein the phase of the first input signal and the phase of the second input signal differ by 90 degrees. A third transistor is connected with a third supply input to the first output of the first transistor, and has a third control input connected to common ground or a reference level and has a third output for providing a first amplified signal of the first input signal. A fourth transistor is connected with a fourth supply input to the second output of the second transistor and has a fourth control input connected to common ground or a reference level and a fourth output for providing a second amplified signal of the second input signal. A phase shifting element is connected between the third output of the third transistor and the fourth output of the fourth transistor for combining the first amplified signal and the second amplified signal in-phase thus forming the output signal of the Doherty amplifier.

Another aspect of the teachings of this application is that a constant current source is connected to the second output of the second transistor and the second emitter of the second transistor.

Another aspect of the teaching of this application is that the presented Doherty amplifier is incorporated in an active antenna arrangement.

Another aspect of the teaching of this application is a method for manufacturing a Doherty amplifier having an input terminal for receiving an input signal, having an output terminal for providing an amplified signal of the input signal, having a first supply voltage terminal for a first supply voltage, having a second supply voltage terminal for a second supply voltage and having a reference terminal for a reference level. The method comprises the steps of connecting the input terminal of the Doherty amplifier to a first input of a first phase shifting element, connecting a first phase shifting element output of the first phase shifting element to a first control input of a first transistor, connecting a first supply input of the first transistor to the second supply voltage terminal, connecting a second supply input of a second transistor to the second supply voltage terminal, connecting a first output of the first transistor to a third supply input of a third transistor, connecting a second output of the second transistor to a fourth supply input of a fourth transistor, connecting a third control input of the third transistor to a reference terminal or ground terminal, connecting a fourth control input of the fourth transistor to a reference terminal or ground terminal, connecting the fourth output of the fourth transistor to a second phase shifting input of a second phase shifting element, connecting a second phase shifting output of the second phase shifting element to the output terminal of the Doherty amplifier, connecting the fourth output of the fourth transistor to a first inductor terminal of a inductor, and connecting a second inductor terminal of the inductor to the first supply voltage terminal.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
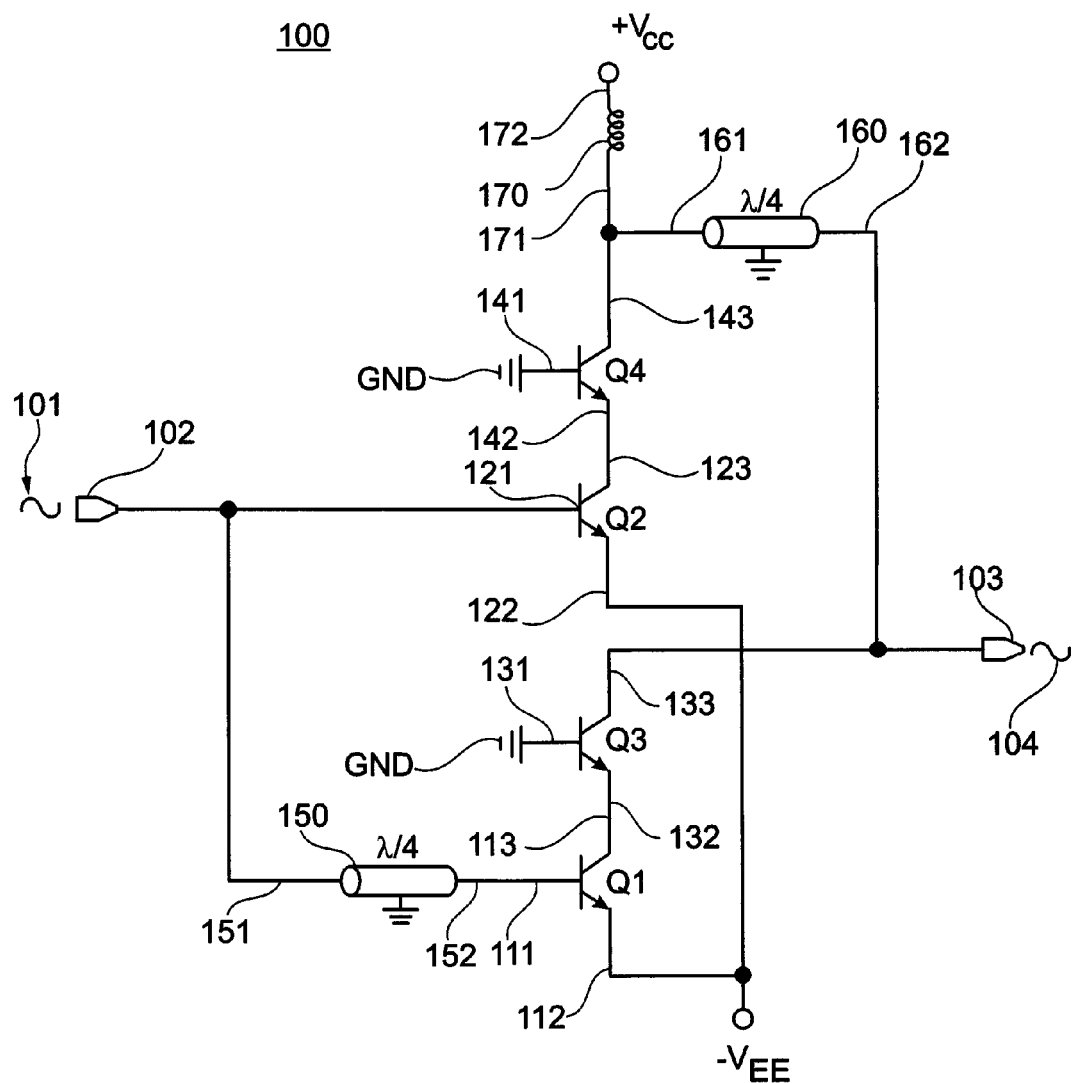
FIG. 1 shows a first aspect of the Doherty amplifier according to the present disclosure

FIG. 1 shows a first aspect of the Doherty amplifier 100 according to the present disclosure. The Doherty amplifier 100 comprises a first transistor Q1, a second transistor Q2, a third transistor Q3, and a fourth transistor Q4. The Doherty amplifier 100 is adapted to amplify a modulated radio signal 101 received at an input port 102 of the Doherty amplifier 100 and to provide an amplified radio signal 104 at an output port 103 of the Doherty amplifier 100. In this first aspect of the disclosure the transistors Q1, Q2, Q3, Q4 are all bipolar transistors of type NPN. For better readability they are referred to as transistors throughout the description of FIG. 1.

The input port 102 of the Doherty amplifier 100 is connected to a first delay line input 151 of a first λ/4-delay line 150. A first delay line output 152 of the first λ/4-delay line 150 is connected to a first base 111 of the first transistor Q1. The first λ/4-delay 150 line is chosen such that the wavelength λ equals the wavelength of the carrier signal of the modulated radio signal 101. By this the phase of the signal between the first delay line input 151 and the first delay line output 152 of the first λ/4-delay line 150 is retarded by 90 degrees.

A first emitter 112 of the first transistor Q1 is connected to a negative supply voltage $-V_{EE}$ that is negative in relation to ground GND. The first collector 113 of the first transistor Q1 is connected to a third emitter 132 of the third transistor Q3. The third collector 133 of the third transistor Q3 is connected to the output port 103 of the Doherty amplifier 100. The third base 131 of the third transistor Q3 is connected to ground GND.

The input port 102 of the Doherty amplifier 100 is also connected to a second base 121 of the second transistor Q2. The second emitter 122 of the second transistor Q2 is connected to the negative supply voltage $-V_{EE}$, whereas a second collector of the second transistor Q2 is connected to a fourth emitter 142 of the fourth transistor Q4. A fourth base 141 of the fourth transistor Q4 is connected to ground GND. The fourth collector 143 of the fourth transistor Q4 is connected to a first inductive element terminal 171 of an inductive element 170. A second inductive element terminal 172 of the inductive element 170 is connected to a positive supply voltage $+V_{CC}$. The inductive element 170, for example a coil serves as a choke allowing direct current to pass whereas the high impedance for radio frequencies substantially blocks the amplified radio frequency to pass through the inductive element 170.

The common connection of the fourth collector 143 of the fourth transistor Q4 and the first inductive element terminal 171 of the inductive element 170 is also connected to a second delay line input 161 of a second λ/4-delay line 160. A second delay line output 162 of the second λ/4-delay line 160 is connected to the output port 103 of the Doherty amplifier 100. The second λ/4-delay 160 line is chosen like the first λ/4-delay 150 such that the wavelength λ equals the wavelength of the carrier signal of the modulated radio signal 101. By this the phase of the signal between its second delay line input 161 and the second delay line output 162 of the second λ/4-delay line 160 is retarded by 90 degrees.

In order to achieve a desired output power level at the output port 103 the voltage of the positive supply voltage is chosen between +20 Volts and +28 Volts. The negative supply voltage is chosen in the present disclosure in a range between −2 Volts and −3 Volts. The person skilled in the art will appreciated that depending on the chosen output power and other design constraints the presented values for the positive supply voltage $+V_{CC}$ and the negative supply voltage $-V_{EE}$ are mere examples and may have to be chosen differently for other applications or due to other different technical characteristics of the chosen transistors. For reason of reducing complexity resistors or any other appropriate means for setting the bias for the first transistor Q1 and the second transistor Q2 to work as a carrier amplifier and a peak amplifier are not shown, as the person skilled in the art will know how to chose the appropriate means for a given application.

As the radio frequency in current mobile communication systems is in a range from 0.7 GHz to 2.6 GHz the first and second transistors Q1, Q2 used in Doherty amplifiers with a supply voltage over 20 Volts must satisfy the technical properties of high speed transistors with a high breakdown voltage, especially a high collector-base breakdown voltage. Transistors having both these properties used specialised technologies for their production, for example a Gallium Arsenide, which renders the transistors relatively expensive. With the arrangement of the third and a fourth transistor Q3, Q4 the first and second transistor Q1, Q2 can be operated at a relatively low breakdown voltage requirement. Another aspect of the third and fourth transistor Q3, Q4 is that the Miller effect of the first and second transistor Q1, Q2 is eliminated, which increases the bandwidth of the Doherty amplifier. By this the transistor types that can be chosen for the first and second transistor Q1, Q2 can be produced in cheaper technology, such as Silicon Germanium. Although the third and fourth transistor Q3, Q4 have to be adopted to withstand the high breakdown voltage, due to the fact that the speed requirement is much lower for the third and fourth transistor Q3, Q4 than for the first and second transistor Q1, Q2 they may be also produced in a cheaper technology, such as Silicon Germanium.

Avoiding the use of specialised technologies may reduce the costs for production down to 10% of the costs for the specialised technology. Another advantage of avoiding the specialised technology is that all transistors can be produced in the same technology. In the event of the integration of the transistors in a chipset, a higher integration level will be achieved.

In the first aspect of the disclosure the transistors Q1, Q2, Q3, Q4 are bipolar transistors of type NPN. In principle the aspect of the present disclosure will also work with bipolar transistors of type PNP. It should be noted that in this case the polarity of the positive supply voltage $+V_{CC}$ and the negative supply voltage $-V_{EE}$ have to be chosen in the opposite way. This aspect of the disclosure is applicable to any type of transistors, such as heterojunction bipolar transistors (HBT) and high electron mobility transistors (HEMT).

Figure 2:
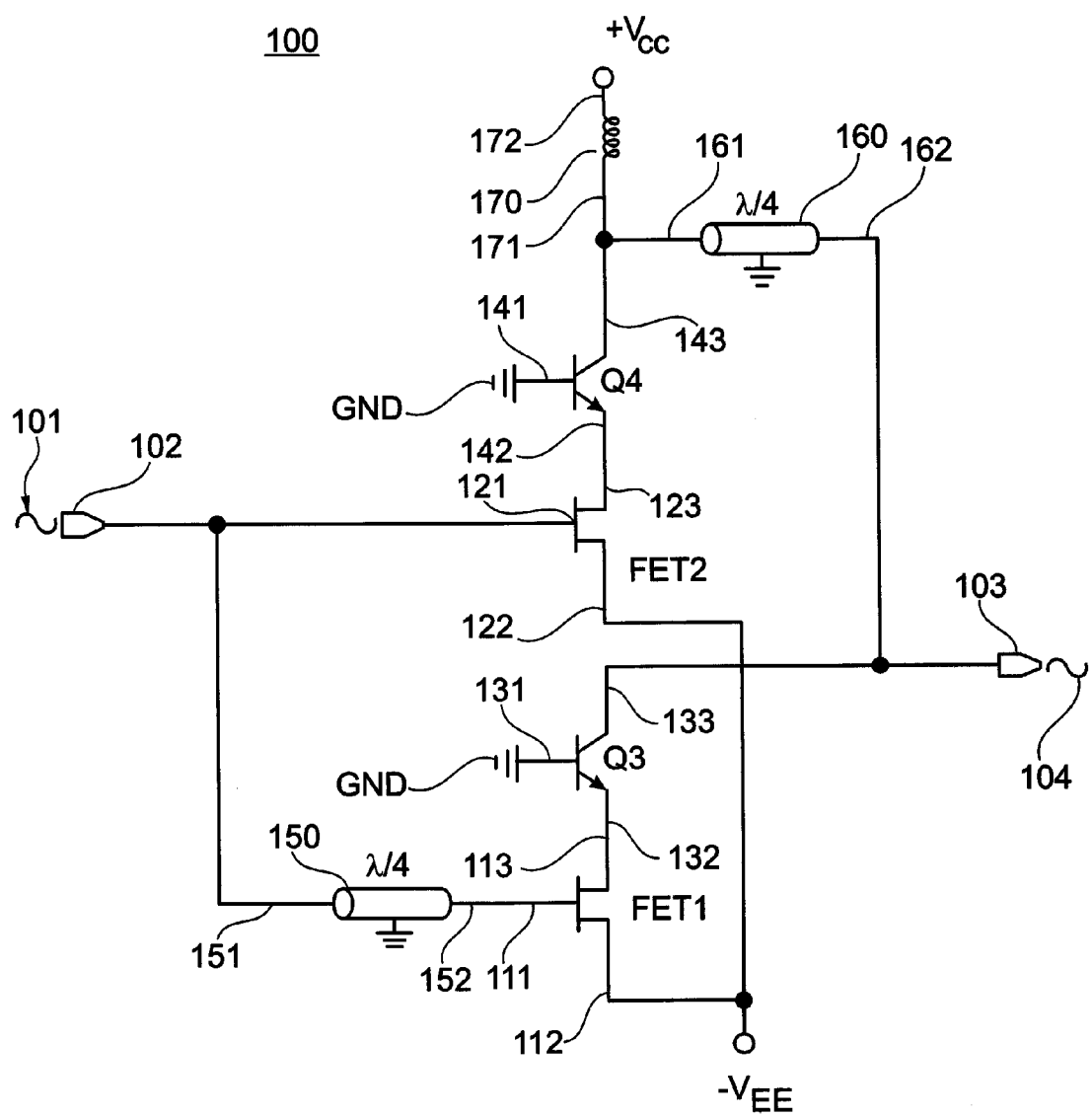
FIG. 2 shows a further aspect of the Doherty amplifier according to the present disclosure

In a second aspect of the disclosure a Doherty amplifier 100 is depicted that uses for the first and second transistor Q1, Q2 transistors of the type field effect transistor. Apart from a first field effect transistors FET1 and a second field effect transistor FET2 the second aspect of the disclosure uses the same elements in the same arrangement as in the first aspect of the disclosure depicted in FIG. 1. As a consequence the same reference numbers are used in FIG. 2 for the same elements.

In the Doherty amplifier 100 of the second aspect of the disclosure the modulated input signal 101 is directly fed to a second gate 121 of the second field effect transistor FET2 and via the first λ/4-delay line 150 to a first gate 111 of the first field effect transistor FET1. A first source 112 of the first field effect transistor FET1 and a second source 122 of the second field effect transistor FET2 are both connected to negative supply voltage $-V_{EE}$. A first drain 113 of the first field effect transistor FET1 is connected to the third emitter 132 of the third transistor Q3. A second drain 123 of the second field effect transistor FET2 is connected to the fourth emitter 142 of the fourth transistor Q4.

Figure 3:
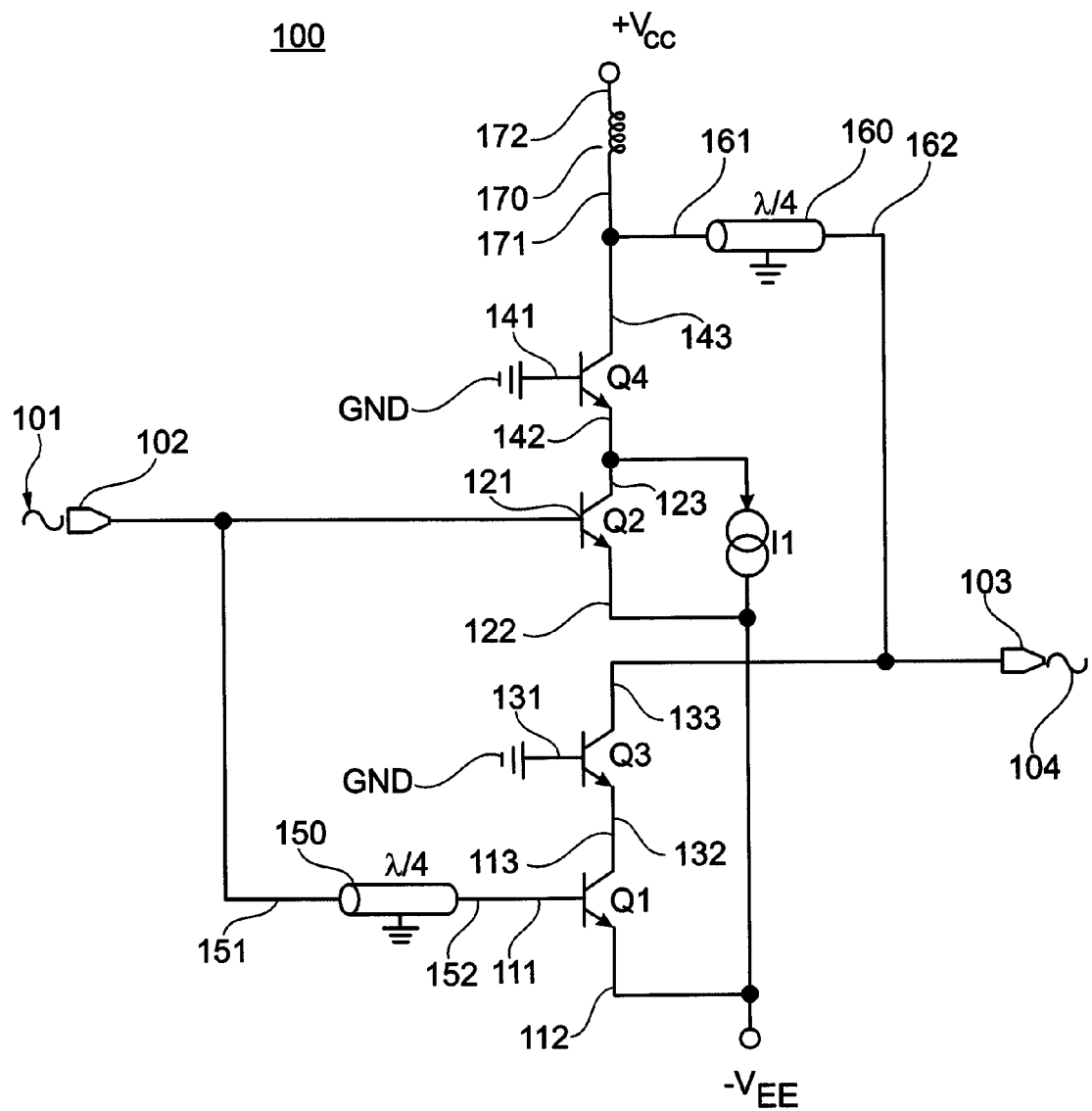
FIG. 3 shows yet another aspect of the Doherty amplifier according to the present disclosure

FIG. 3 shows another aspect of the disclosure. The arrangement is similar to the arrangement shown in FIG. 1 and the same reference numbers have been used as in FIG. 1. In addition to the arrangement of the first aspect of the disclosure a constant current source circuit I1 is connected between the fourth emitter 142 of the fourth transistor Q4 and the negative supply voltage $-V_{EE}$ providing a constant current. In this aspect of the present disclosure the constant current source circuit I1 stands as an example for all equivalents to constant current sources. The person skilled in the art may decide for example, that a resistor, although an imperfect constant source, may be sufficient for the same purpose. The constant current (or substantially constant current in the event of a mere resistor) is chosen such that in the event the second transistor Q2 is in a non-conductive stage, the current that flows through from the fourth collector 143 of the fourth transistor Q4 to the fourth emitter 142 of the fourth transistor Q4 is preferably just so high to operate the fourth transistor Q4 beyond in forward region even if Q2 is in cutoff region. When the second transistor Q2 is used as a peak power amplifier stage, the constant current source circuit I1 will ensure a fast response of the fourth transistor Q4 when the second transistor Q2 is driven by an input signal from cutoff region to forward region.

Figure 4:
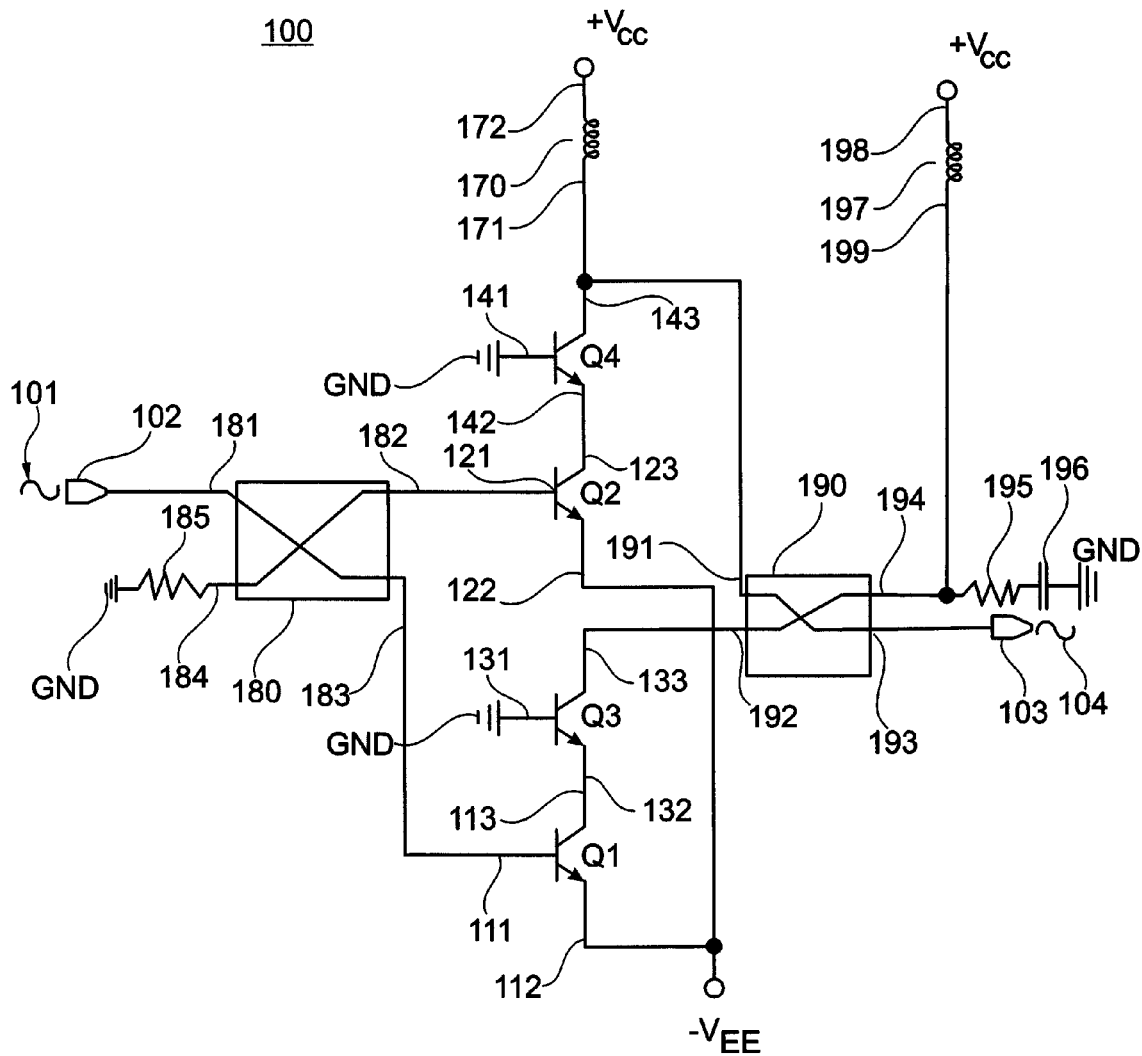
FIG. 4 shows yet another aspect of the Doherty amplifier according to the present disclosure

FIG. 4 shows another aspect of the disclosure. The arrangement is similar to the arrangement shown in FIG. 1. Instead of the first λ/4-delay lines 150 and the second λ/4-delay line 160 quadrature couplers 180, 190 are used as phase shifting elements. A quadrature, coupler 180, 190 can be either used to split signals or to combine signals. In power splitting mode a quadrature coupler can receive an input signal and produces two output signals. The input power is equally divided between the two signals, but due to the general design principle of a quadrature coupler the two output signals are 90 degrees apart in phase. In power combining mode a quadrature coupler receives two input signals and provides a signal that is a combination of its both input signals. In the course of combination one of the input signals is retarded by 90 degrees in relation to the other input signal. Often a so-called isolated port is terminated with an internal or external matched load.

In FIG. 4 the input signal 101 of the Doherty amplifier 100 is fed to a first quadrature coupler input port 181 of a first quadrature coupler 180, which is operated in power splitting mode. A first quadrature coupler output port 182 of the first quadrature coupler 180 is connected to the second base 121 of the second transistor Q2. A second quadrature coupler output port 183 of the first quadrature coupler 180 is connected to the first base 111 of the first transistor Q1. A first isolated port 184 of the first quadrature coupler 180 is connected via a first resistor 185 with the reference level GND. The third collector 133 of the third transistor Q3 is connected to a second quadrature coupler input port 192 of a second quadrature coupler 190, which is operated in combining mode. The fourth collector 143 of the fourth transistor Q4 is connected to a third quadrature coupler input port 191 of the second quadrature coupler 190. A second isolated port 194 of the second quadrature coupler 190 is connected via a second resistor 195 to a first capacitor terminal of a capacitor 196. A second capacitor terminal of the second capacitor 196 is connected with the reference level GND.

The second isolated port 194 is also connected with a third inductive element terminal 199 of a second inductive element 197. A fourth inductive element terminal 198 of the second inductive element 197 is connected to the positive supply voltage $+V_{CC}$. The second inductive element 197, for example a coil serves as a choke allowing direct current to pass whereas the high impedance for radio frequencies substantially blocks the amplified radio frequency signal to pass through the second inductive element 197. As the capacitor 196 blocks direct current from flowing to the ground level GND, the positive supply voltage $+V_{CC}$ flows unhindered from the second isolated port 194 through the seocond quatrature coupler 190 to the second quatrature input port 192. It serves there as the supply voltage for the third transistor Q3 and the first transistor Q1.

The first resistor 185 and the second resistor 195 are chosen to match the impedance of the first quadrature coupler 180 and the second quadrature coupler 190. As the capacitor 196 has a low impedance for radio signals it does not disturb matching the second isolated port 194 with the second load resistor 195. The first quadrature coupler output port 182 and the second quadrature coupler output port 183 of the first quadrature coupler 180 and the second quadrature coupler input port 192 and the third quadrature coupler input port 191 of the second quadrature coupler 190 are chosen in their order such that the output signal at the third quadrature coupler output port 193 of the second quadrature coupler 190 is an in-phase combination of the respective input signals at the first quadrature coupler output port 182 of the first quadrature coupler 180 and the second quadrature coupler output port 183 of the first quadrature coupler 180.

The use of quadrature couplers 180, 190 reduces the overall space of the Doherty amplifier 100.

Figure 5:
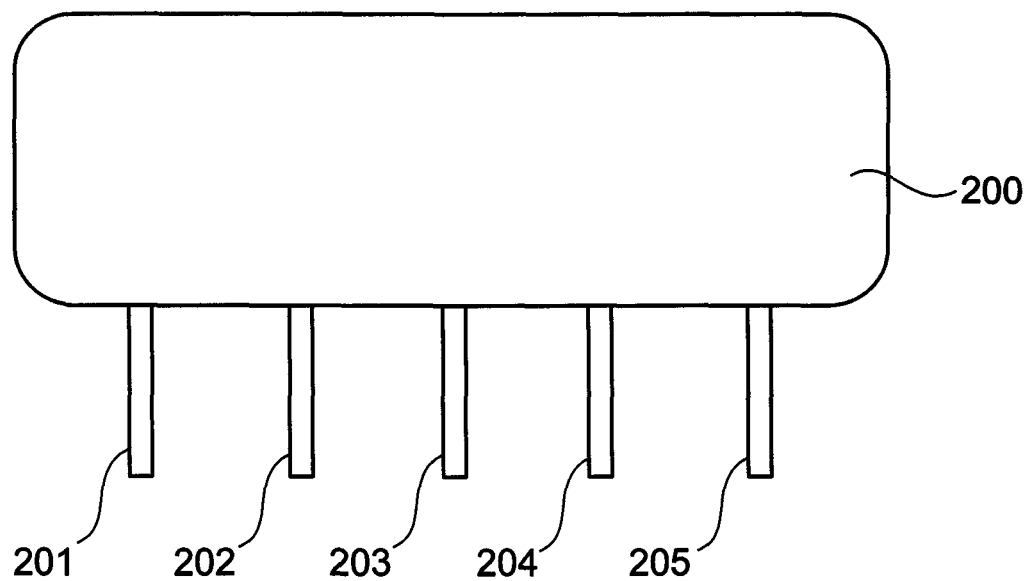
FIG. 5 shows a hybrid module incorporating a Doherty amplifier according to the present disclosure

Another aspect of the disclosure is the composition of the elements of a Doherty amplifier on a hybrid module 200 as shown in FIG. 5 which provides several external terminals. An input terminal 201 for receiving an input signal, an output terminal 202 for providing an amplified signal of the input signal, a first supply voltage terminal 203 for a first supply voltage, a second supply voltage terminal 204 for second supply voltage, and a reference terminal 205 for a reference level GND.

Figure 6:
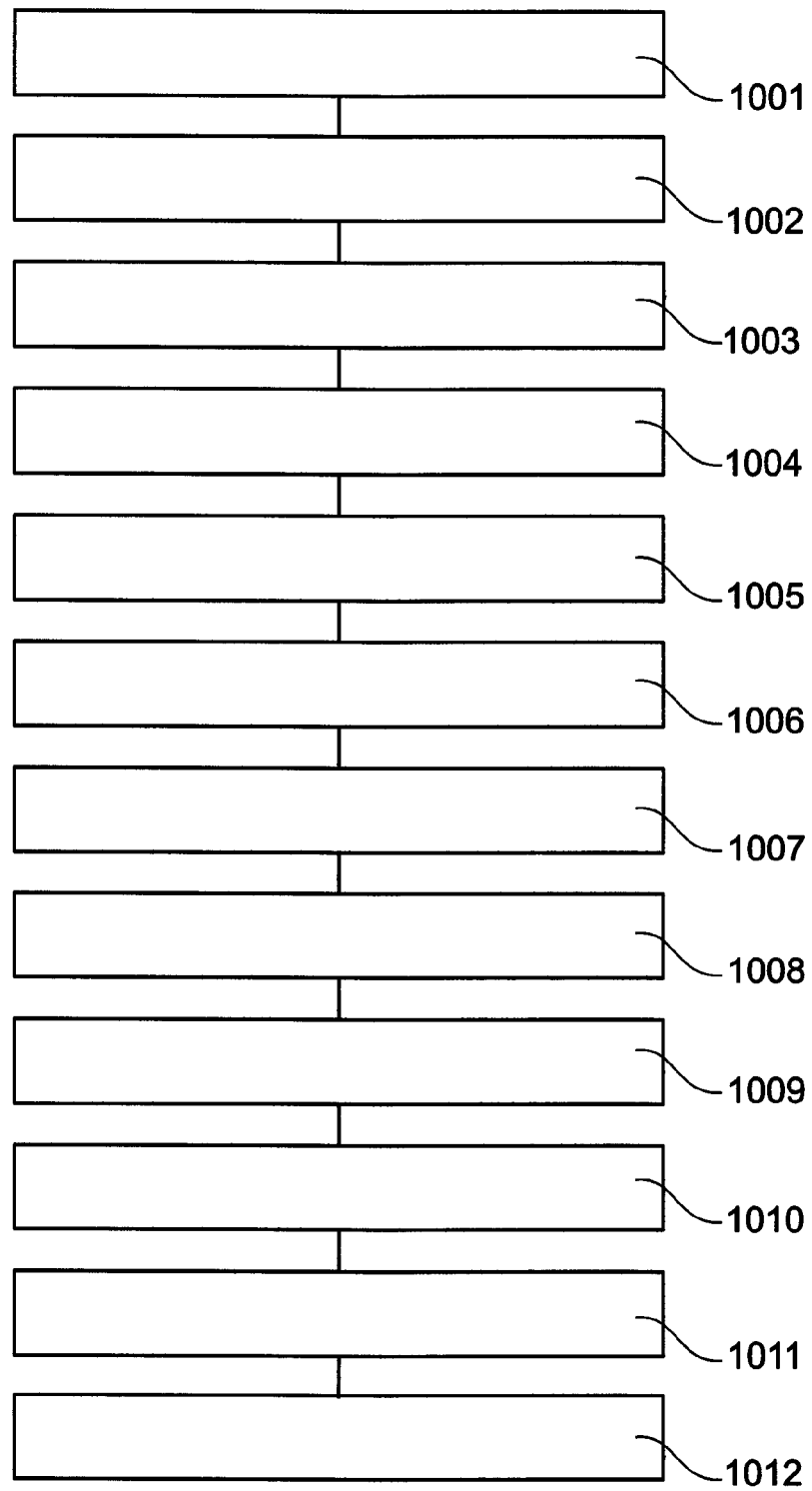
FIG. 6 shows a method for manufacturing a Doherty amplifier according to the present disclosure

The manufacturing steps of such a hybrid module 200 is shown FIG. 6. In the manufacturing process the following steps will be executed:

In a first step 1001 the input terminal 201 of the Doherty amplifier hybrid module 200 is connected to the first phase shifting element input 181 of the first phase shifting element 180.

In a second step 1002 the first phase shifting element output 182 of the first phase shifting element 180 is connected to the second control input 121 of the second transistor Q2.

In a third step 1003 the first supply input 112 of the first transistor Q1 is connected to the second supply voltage terminal 204 of the hybrid module 200.

In a fourth step 1004 the second supply input 122 of the second transistor Q2 is connected to the second supply voltage terminal 204 of the hybrid module 200.

In a fifth step 1005 the first output 113 of the first transistor Q1 is connected to a third supply input 132 of the third transistor Q3.

In a sixth step the second output 123 of the second transistor Q2 is connected to the fourth supply input 142 of the fourth transistor Q4.

In a seventh step 1007 the third control input 131 of the third transistor Q3 is connected to ground terminal 205 of the hybrid module 200.

In an eight step 1008 the fourth control input 141 of the fourth transistor Q4 is connected to ground terminal 205 of the hybrid module 200.

In a ninth step 1009 the fourth output 143 of the fourth transistor Q4 is connected to a second phase shifting element input 191 of a second phase shifting element 190.

In a tenth step 1010 a third phase shifting element output 193 of the second phase shifting element 190 is connected to the output terminal 205 of the hybrid module 200.

In an eleventh step 1011 the fourth output 143 of the fourth transistor Q4 is connected to a first inductance terminal 171 of a first inductance 170.

In a twelfth step a second inductance terminal 172 of the first inductance 170 is connected to the first supply voltage terminal 203 of the hybrid module 200.

The order of the process steps described above were chosen in an order following roughly the flow of a signal from the input 201 of the hybrid module 200 to the output 202 of the hybrid module 200. Thus the order was thought for illustration purposes only. The person skilled in the art will appreciate that the manufacturing steps can be executed in any order.

The present disclosure further relates to a computer program product embedded on a computer readable medium. The computer program product comprises executable instructions for the manufacture of the Doherty amplifier of the present disclosure.

While various embodiments of the present invention have been described above, it should be understood that they have been presented by way of example, and not limitation. It will be apparent to persons skilled in the relevant arts that various changes in form and detail can be made therein without departing from the scope of the invention. Thus, the present invention should not be limited by any of the above-described exemplary embodiments, but should be defined only in accordance with the following claims and their equivalents.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A Doherty amplifier having an input terminal for receiving an input signal and having an output terminal for providing an amplified signal of the input signal, the Doherty amplifier being supplied by a first supply voltage and a second supply voltage which have opposite polarities in respect to a reference level, the Doherty amplifier further comprising:
 a first transistor, having a first control input for receiving a first input signal derived from the input signal, having a first output, and having a first supply input connected to the second supply voltage;
 a second transistor, having a second control input for receiving a second input signal being derived from the input signal, having a second output, and having a second supply input connected to the second supply voltage, wherein the phase of the first input signal and the phase of the second input signal differ by 90 degrees and a constant current source is connected to the second output of the second transistor and the second supply input of the second transistor;
 a third transistor, being connected with a third supply input to the first output of the first transistor, and having a third control input connected to the reference level and having a third output for providing a first amplified signal of the first input signal;

a fourth transistor, being connected with a fourth supply input to the second output of the second transistor and having a fourth control input connected to the reference level, and having a fourth output for providing a second amplified signal of the second input signal; and a phase shifting element connected between the third output of the third transistor and the fourth output of the fourth transistor for combining the first amplified signal and the second amplified signal in-phase thus forming the output signal of the Doherty amplifier.

2. The Doherty amplifier according to claim 1
wherein the first transistor is a bipolar transistor, the first control input for receiving the first input signal is the base of the first transistor, the first output of the first transistor is the collector of the first transistor, and the first supply input is the emitter of the first transistor
wherein the second transistor is a bipolar transistor, the second control input for receiving the second input signal is the base of the second transistor, the second output of the second transistor is the collector of the second transistor, and the second supply input is the emitter of the second transistor.

3. The Doherty amplifier according to claim 1
wherein the first transistor is a field effect transistor, the first control input for receiving the first input signal is the gate of the first transistor, the first output of the first transistor is the drain of the first transistor, and the first supply input is the source of the first transistor
wherein the second transistor is a field effect transistor, the second control input for receiving the second input signal is the gate of the second transistor, the second output of the second transistor is the drain of the second transistor, and the second supply input is the source of the second transistor.

4. The Doherty amplifier according to claim 1 wherein the first supply voltage is with respect to reference level a positive supply voltage in the range of 20 Volts to 28 Volts.

5. The Doherty amplifier according to claim 1 wherein the second supply voltage is with respect to the reference level a negative supply voltage in the range of −2 Volts to −3 Volts.

6. The Doherty amplifier according to claim 1
wherein a first $\lambda/4$ phase shifting element is inserted between the input terminal of the Doherty amplifier and the first input of the first transistor and
wherein a second $\lambda/4$ phase shifting element is inserted between the third output of the third transistor and the fourth output of the fourth transistor.

7. The Doherty amplifier according to claim 5 wherein at least one of the first $\lambda/4$ phase shifting element or the second $\lambda/4$ phase shifting element is one of a delay line or a quadrature coupler.

8. A chip set comprising a Doherty amplifier having an input terminal for receiving an input signal and having an output terminal for providing an amplified signal of the input signal, the Doherty amplifier being supplied by a first supply voltage and a second supply voltage which have opposite polarities in respect to a reference level, the Doherty amplifier further comprising:

a first transistor, having a first control input for receiving a first input signal derived from the input signal, having a first output, and having a first supply input connected to the second supply voltage;

a second transistor, having a second control input for receiving a second input signal being derived from the input signal, having a second output, and having a second supply input connected to negative supply voltage, wherein the phase of the first input signal and the phase of the second input signal differ by 90 degrees, and a constant current source is connected to the second output of the second transistor and the second supply input of the second transistor;

a third transistor, being connected with a third source supply input to the first output of the first transistor, and having a third control input connected to common ground and having a third output for providing a first amplified signal of the first input signal;

a fourth transistor, being connected with a fourth supply input to the second output of the second transistor and having a fourth control input connected to common ground, and having a fourth output for providing a second amplified signal of the second input signal; and a phase shifting element connected between the third output of the third transistor and the fourth output of the fourth transistor for combining the first amplified signal and the second amplified signal in-phase thus forming the output signal of the Doherty amplifier.

9. The chipset according to claim 8 wherein the chip set is formed by a hybrid circuit.

10. An active antenna array comprising at least one Doherty amplifier having an input terminal for receiving an input signal and having an output terminal for providing an amplified signal of the input signal, the Doherty amplifier being supplied by a first supply voltage and a second supply voltage which have opposite polarities in respect to a reference level, the Doherty amplifier further comprising:

a first transistor, having a first control input for receiving a first input signal derived from the input signal, having a first output, and having a first supply input connected to the second supply voltage;

a second transistor, having a second control input for receiving a second input signal being derived from the input signal, having an output, and having a second supply input connected to the second supply voltage, wherein the phase of the first input signal and the phase of the second input signal differ by 90 degrees, and a constant current source is connected to the second output of the second transistor and the second supply input of the second transistor;

a third transistor, being connected with a third supply input to the first output of the first transistor, and having a third control input connected to the reference level and having a third output for providing a first amplified signal of the first input signal;

a fourth transistor, being connected with a fourth supply input to the second output of the second transistor and having a fourth control input connected to the reference level, and having a fourth output for providing a second amplified signal of the second input signal; and a phase shifting element connected between the third output of the third transistor and the fourth output of the fourth transistor for combining the first amplified signal and the second amplified signal in-phase thus forming the output signal of the Doherty amplifier.

11. A method for manufacturing a Doherty amplifier having an input terminal for receiving an input signal, having an output terminal for providing an amplified signal of the input signal, having a first supply terminal for a first supply voltage, having a second supply terminal for a second supply voltage and having a reference terminal for a reference level, the method comprising the steps of:

connecting the input terminal of the Doherty amplifier to a first input of a first phase shifting element;

connecting a first output of the first phase shifting element to a first control input of a first transistor;

connecting a first supply input of the first transistor to the second supply voltage terminal;

connecting a second supply input of a second transistor to the negative supply voltage terminal;

connecting a first output of the first transistor to a third supply input of a third transistor;

connecting a second output of the second transistor to a fourth supply input of a fourth transistor;

connecting the second output of the second transistor to the second supply input of the second transistor;

connecting a third control input of the third transistor to the reference terminal;

connecting a fourth control input of the fourth transistor to the reference terminal;

connecting the fourth output of the fourth transistor to a second input of a second phase shifting element;

connecting a second output of the second phase shifting element to the output terminal of the Doherty amplifier;

connecting the fourth output of the fourth transistor to a first inductance terminal of a first inductance; and connecting a second inductance terminal of the first inductance to the first supply voltage terminal.

12. A computer program product comprising a non-transitory computer-usable medium having control logic stored therein for causing a computer to manufacture a Doherty amplifier having an input terminal for receiving an input signal and having an output terminal for providing an amplified signal of the input signal, the Doherty amplifier being supplied by a first supply voltage and a second supply voltage which have opposite polarities in respect to a reference level, the Doherty amplifier further comprising:

a first transistor, having a first control input for receiving a first input signal derived from the input signal, having a first output, and having a first supply input connected to the second supply voltage;

a second transistor, having a second control input for receiving a second input signal being derived from the input signal, having an output, and having a second supply input connected to the second supply voltage, wherein the phase of the first input signal and the phase of the second input signal differ by 90 degrees, and a constant current source is connected to the second output of the second transistor and the second supply input of the second transistor;

a third transistor, being connected with a third supply input to the first output of the first transistor, and having a third control input connected to the reference level and having a third output for providing a first amplified signal of the first input signal;

a fourth transistor, being connected with a fourth supply input to the second output of the second transistor and having a fourth control input connected to the reference level, and having a fourth output for providing a second amplified signal of the second input signal; and a phase shifting element connected between the third output of the third transistor and the fourth output of the fourth transistor for combining the first amplified signal and the second amplified signal in-phase thus forming the output signal of the Doherty amplifier.

* * * * *